(12) United States Patent
Hiraga

(10) Patent No.: US 11,211,436 B2
(45) Date of Patent: Dec. 28, 2021

(54) DISPLAY DEVICE

(71) Applicant: Japan Display Inc., Minato-ku (JP)

(72) Inventor: Kenta Hiraga, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 13 days.

(21) Appl. No.: 16/112,876

(22) Filed: Aug. 27, 2018

(65) Prior Publication Data

US 2019/0067393 A1 Feb. 28, 2019

(30) Foreign Application Priority Data

Aug. 31, 2017 (JP) .............................. JP2017-166438

(51) Int. Cl.
| | |
|---|---|
| *H01L 27/32* | (2006.01) |
| *H01L 51/52* | (2006.01) |
| *H01L 51/50* | (2006.01) |
| *H01L 51/00* | (2006.01) |
| *C23C 14/04* | (2006.01) |

(52) U.S. Cl.
CPC ........ *H01L 27/3246* (2013.01); *C23C 14/044* (2013.01); *H01L 27/3258* (2013.01); *H01L 27/3272* (2013.01); *H01L 51/0011* (2013.01); *H01L 51/5012* (2013.01); *H01L 51/5206* (2013.01); *H01L 51/5221* (2013.01); *H01L 27/3211* (2013.01)

(58) Field of Classification Search
CPC ... H01L 51/5012–5044; H01L 51/0008; H01L 51/001; H01L 51/0011; H01L 27/3246; C23C 14/044
See application file for complete search history.

(56) References Cited

U.S. PATENT DOCUMENTS

| | | | |
|---|---|---|---|
| 7,365,367 B2 * | 4/2008 | Han | H01L 27/3246 257/40 |
| 2001/0036691 A1 * | 11/2001 | Kitazume | C23C 14/044 438/160 |
| 2002/0197393 A1 * | 12/2002 | Kuwabara | H01L 51/0003 427/66 |
| 2005/0285509 A1 * | 12/2005 | Funamoto | H01L 51/5275 313/504 |
| 2008/0036374 A1 * | 2/2008 | Okano | G02B 5/20 313/506 |
| 2010/0133573 A1 | 6/2010 | Nowatari et al. | |
| 2011/0260156 A1 | 10/2011 | Nowatari et al. | |
| 2012/0235166 A1 | 9/2012 | Nowatari et al. | |

(Continued)

FOREIGN PATENT DOCUMENTS

JP 2017-54832 3/2017

*Primary Examiner* — Jesse Y Miyoshi
(74) *Attorney, Agent, or Firm* — Oblon, McClelland, Maier & Neustadt, L.L.P.

(57) ABSTRACT

A display device includes: an insulating layer defining a pixel region with a first extending portion and a second extending portion, the first extending portion extending in a direction along a first side of the pixel region, the second extending portion extending in a direction along a second side of the pixel region, the second side crossing the first side; and an organic electroluminescent layer formed in the pixel region, on the first extending portion, and on the second extending portion. A width of the first extending portion in a plan view is smaller than a width of the second extending portion.

5 Claims, 10 Drawing Sheets

(56) References Cited

U.S. PATENT DOCUMENTS

| | | | |
|---|---|---|---|
| 2013/0017752 A1* | 1/2013 | Kajitani | H01L 27/3246 445/58 |
| 2013/0228766 A1 | 9/2013 | Nowatari et al. | |
| 2014/0070198 A1 | 3/2014 | Nowatari et al. | |
| 2016/0133869 A1* | 5/2016 | Nendai | H01L 27/3246 257/40 |

* cited by examiner

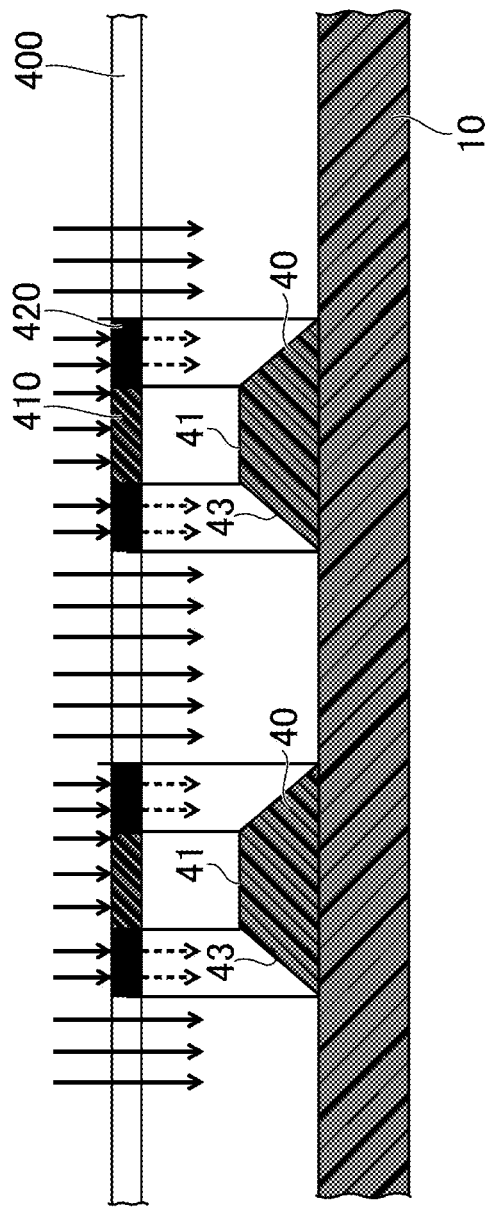

DISPLAY DEVICE

CROSS-REFERENCE TO RELATED APPLICATION

The present application claims priority from Japanese application JP2017-166438 filed on Aug. 31, 2017, the content of which is hereby incorporated by reference into this application.

BACKGROUND OF THE INVENTION

1. Field of the Invention

The present invention relates to a display device.

2. Description of the Related Art

A display device including a bank defining a pixel region, and an organic electroluminescent layer formed on the pixel region and the bank has been conventionally known (e.g., FIGS. 5A to 5C in JP 2017-54832 A). The organic electroluminescent layer is formed by vapor deposition. Specifically, a material that serves as the organic electroluminescent layer is discharged from a line source as a vapor deposition source through a vapor deposition mask in which an opening is formed, so that the organic electroluminescent layer is pattern-formed so as to correspond to the shape of the opening of the vapor deposition mask.

Here, the material discharged from the vapor deposition source is discharged obliquely at a predetermined discharge angle; while a portion of the material obliquely discharged is obstructed at the opening edge portion of the vapor deposition mask, which may generate a region where the film thickness of the organic electroluminescent layer is thin in the vicinity of the opening edge portion. That is, around the boundary between the pixel region and the bank in the pixel region, a portion that is a shadow of the vapor deposition mask, the bank, or the like is present in the direction of vapor deposition from the vapor deposition source, and therefore, the region where the film thickness of the organic electroluminescent layer is thin is generated. When the region where the film thickness of the organic electroluminescent layer is thin is generated in a light emitting region, an electric current is concentrated in the region, which may cause a trouble such as a reduction in luminous efficiency, a shorter life span, and a color shift. Therefore, the width of the bank is set such that the region where the film thickness of the organic electroluminescent layer is thin is not formed in the light emitting region but is formed on the bank as a non-light emitting region. Conventionally, the bank has been formed with a common width at any portion that defines the pixel region, and thus formed excessively wide at a portion at which the region where the film thickness of the organic electroluminescent layer is thin is less likely to be formed. In such a configuration, the space between pixels is widened, which exerts an undesirable effect on realizing a higher definition of pixels. Alternatively, the area of the pixel region is limited, which is an obstacle to a higher luminance of the display device.

SUMMARY OF THE INVENTION

It is an object of the invention to realize a higher opening ratio and higher definition of pixels without reducing luminous efficiency.

A display device according to an aspect of the invention includes: an insulating layer defining a pixel region with a first extending portion and a second extending portion, the first extending portion extending in a direction along a first side of the pixel region, the second extending portion extending in a direction along a second side of the pixel region, the second side crossing the first side; and an organic electroluminescent layer formed in the pixel region, on the first extending portion, and on the second extending portion, wherein a width of the first extending portion in a plan view is smaller than a width of the second extending portion.

BRIEF DESCRIPTION OF THE DRAWINGS

FIG. 10 is a diagram illustrating the formation of the insulating layer using a halftone mask in the embodiment.

DETAILED DESCRIPTION OF THE INVENTION

Figure 1:
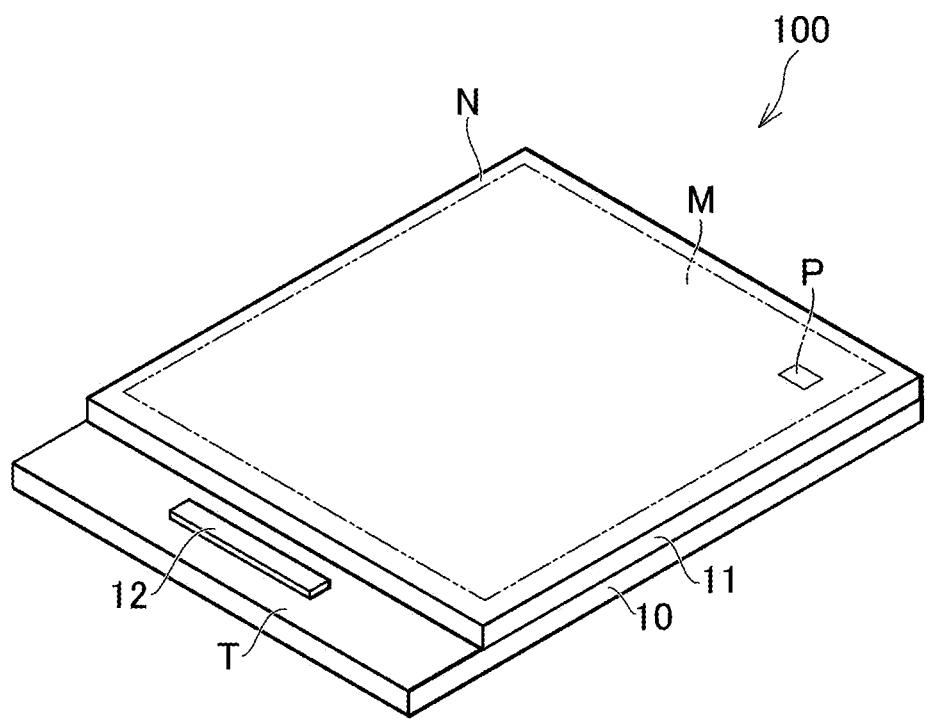
FIG. 1 is a perspective view schematically showing an overall configuration of a display device according to an embodiment.

Hereinafter, an embodiment of the invention (hereinafter referred to as "the embodiment") will be described with reference to the drawings. However, the invention can be implemented in various aspects within the scope not departing from the gist of the invention, and should not be interpreted as being limited to the details described in the following exemplary embodiment.

In the drawings, for more clarity of description, the width, thickness, shape, and the like of each part may be schematically represented compared to those in practicing aspects of the invention. However, they are illustrative only and do not limit the interpretation of the invention. In the specification and the drawings, elements having functions similar to those described in relation to a previous drawing are denoted by the same reference numerals and signs, and a redundant description may be omitted.

Further, in the embodiment, the terms "on" and "under" as used in defining the positional relationship between one component and another component include, not only the case where one component is located directly on or directly under another component, but also the case where one component is located above (or below) another layer or region, that is, the case where still another component is present between the components unless otherwise noted. In the following description, the side on which a second substrate is disposed with respect to a first substrate is described as being "top" or "upward" while the opposite side is described as being "bottom" or "downward" in a cross-sectional view unless otherwise noted.

FIG. 1 is a perspective view showing an outline of an overall configuration of a display device according to the embodiment. In the embodiment, an organic electroluminescent display device is exemplified as a display device 100. The display device 100 includes, for example, pixel regions P of multiple colors of red, green, and blue, and is configured to display a full-color image. In the following description, when it is necessary to distinguish which color the pixel region is, each of Sign R representing a red pixel region, Sign G representing a green pixel region, and Sign B representing a blue pixel region is attached to Sign P representing the pixel region; however, when it is unnecessary to distinguish the pixel regions, the pixel regions are each referred to simply as "pixel region P".

The display device 100 includes a first substrate 10 having a rectangular (e.g., oblong) external shape, and a second substrate 11 disposed to face the first substrate 10. The first substrate 10 is formed of a polyimide resin, polyethylene terephthalate, or the like, and preferably has flexibility. The first substrate 10 includes a display region M where a plurality of the pixel regions P are disposed in a matrix. Only one pixel region P is shown in FIG. 1; however, the pixel regions P are disposed in the substantially entire display region M. Moreover, the first substrate 10 includes a picture-frame region N around the display region M. Further, the first substrate 10 includes a terminal region T. In the terminal region T, an integrated circuit chip 12 for driving elements for displaying an image is mounted. Although not shown in the drawing, a flexible board may be electrically connected to the terminal region T.

Figure 2:
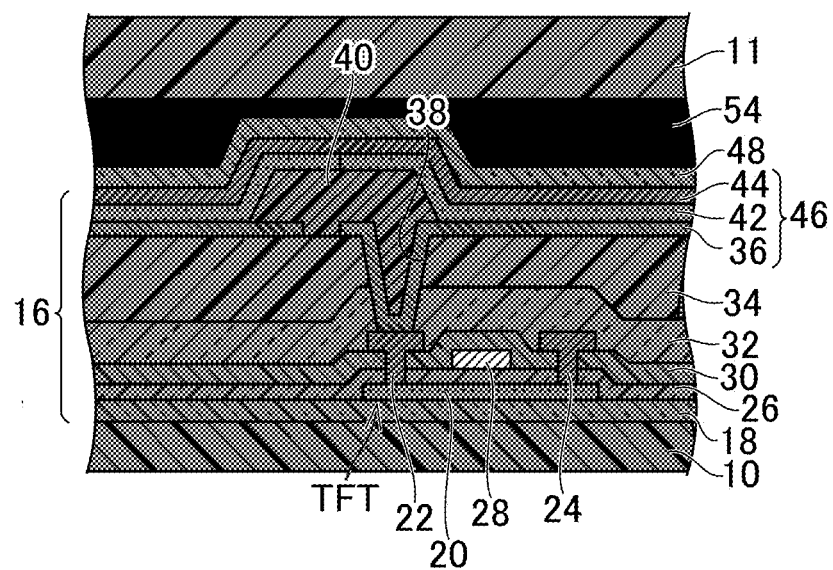
FIG. 2 is a cross-sectional view showing the display device according to the embodiment.

With reference to FIG. 2, the details of a stacked structure of the display device 100 will be described. FIG. 2 is a cross-sectional view showing the display device according to the embodiment. A display circuit layer 16 including a plurality of layers is stacked on the first substrate 10. The display circuit layer 16 includes an undercoat layer 18 serving as a barrier to impurities contained in the first substrate 10. The undercoat layer 18 is made of an inorganic material such as a silicon oxide film or a silicon nitride film, or may be a stacked structure of a silicon oxide film and a silicon nitride film. A semiconductor layer 20 is formed on the undercoat layer 18. A source electrode 22 and a drain electrode 24 are electrically connected to the semiconductor layer 20, and a gate insulating film 26 is formed to cover the semiconductor layer 20. The gate insulating film 26 is also made of an inorganic material. A gate electrode 28 is formed on the gate insulating film 26, and an interlayer insulating film 30 is formed to cover the gate electrode 28. The interlayer insulating film 30 is also made of an inorganic material. The source electrode 22 and the drain electrode 24 penetrate the gate insulating film 26 and the interlayer insulating film 30. At least a portion of a thin film transistor TFT is composed of the semiconductor layer 20, the source electrode 22, the drain electrode 24, and the gate electrode 28. A passivation film 32 is provided so as to cover the thin film transistor TFT. The passivation film 32 is also made of an inorganic material. The passivation film 32 may be omitted.

A planarization layer 34 is provided on the passivation film 32. A plurality of pixel electrodes 36 (e.g., anodes) are provided on the planarization layer 34 so as to respectively correspond to the plurality of pixel regions P. The planarization layer 34 is formed such that at least a surface thereof on which the pixel electrode 36 is provided is flat. An organic material such as a photosensitive acrylic resin is preferably used as the planarization layer 34. The pixel electrode 36 is electrically connected to one of the source electrode 22 and the drain electrode 24 located on the semiconductor layer 20 through a contact hole 38 penetrating the planarization layer 34 and the passivation film 32.

An insulating layer (bank) 40 defining the plurality of pixel regions P is formed on the planarization layer 34 and the pixel electrode 36. An organic material such as a photosensitive acrylic resin or polyimide is preferably used as the insulating layer 40. The insulating layer 40 is formed so as to cover the edge portions of the pixel electrodes 36 in the pixel regions P next to each other.

In this example, although described in detail later, the pixel region P has a rectangular shape including short sides and long sides in a plan view, and the insulating layer 40 includes first extending portions 40a extending along the short side of the pixel region P, and second extending portions 40b extending along the long side of the pixel region P. Each of the pixel regions P is defined by two first extending portions 40a and two second extending portions 40b.

An organic electroluminescent layer 42 is provided on the pixel electrode 36 and on the insulating layer 40. The organic electroluminescent layer 42 is provided separately (isolatedly) for each of the pixel electrodes 36, and configured to emit blue, red, or green light corresponding to each of the pixel regions P. The colors corresponding to the pixel regions P are not limited thereto, and, for example, yellow, white, or the like may be added thereto.

A common electrode 44 (e.g., a cathode) is provided on the organic electroluminescent layer 42. The common electrode 44 is continuous above the pixel electrodes 36 next to each other. The organic electroluminescent layer is interposed between the pixel electrode 36 and the common electrode 44, and emits light with a luminance controlled by an electric current flowing therebetween.

The organic electroluminescent layer 42 includes at least a light emitting layer, and may include a hole transport layer, a hole injection layer, an electron transport layer, and an electron injection layer. At least a portion of a light emitting element 46 is composed of the pixel electrode 36, the organic electroluminescent layer 42, and the common electrode 44.

A sealing layer 48 covers a plurality of the light emitting elements 46. With this configuration, the light emitting element 46 is shielded from moisture. The sealing layer 48 includes an inorganic film such as of SiN or SiOx, and may be a single layer or a stacked structure. For example, the inorganic film may have a structure in which inorganic films interpose an organic film of resin such as an acrylic resin from above and below. An adhesive layer 54 is provided on the sealing layer 48, and the second substrate 11 is provided on the adhesive layer 54. A touch panel may be provided on the second substrate 11.

Figure 3:
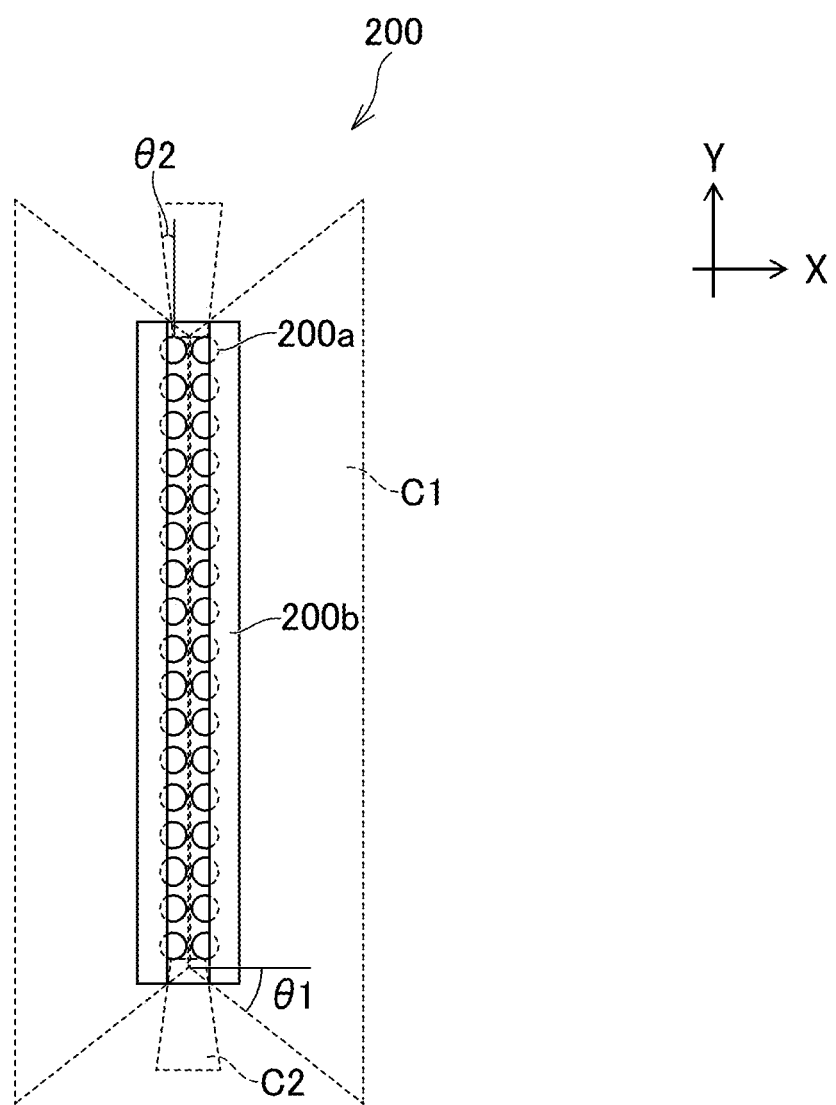
FIG. 3 is a diagram illustrating a vapor deposition source.
Figure 4:
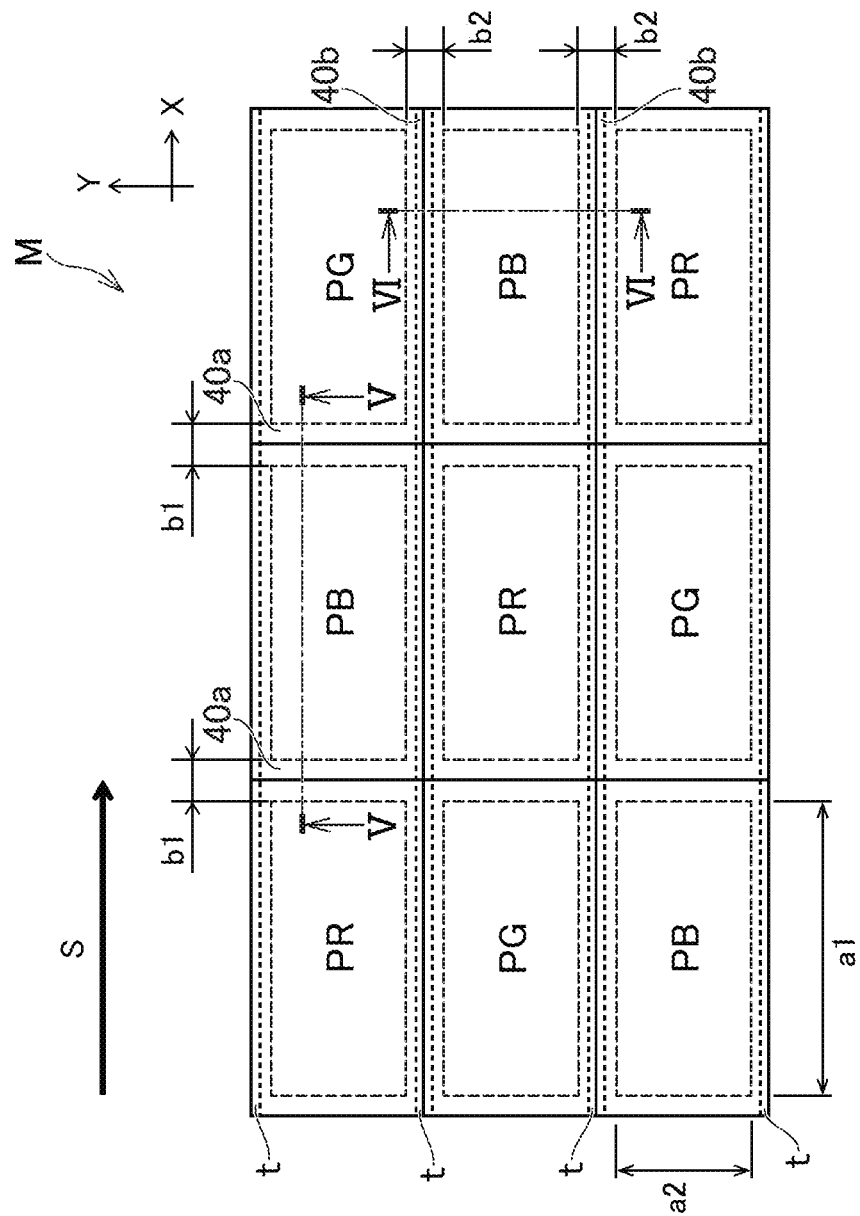
FIG. 4 is a plan view schematically showing a portion of a display region in a conventional example.
Figure 5:
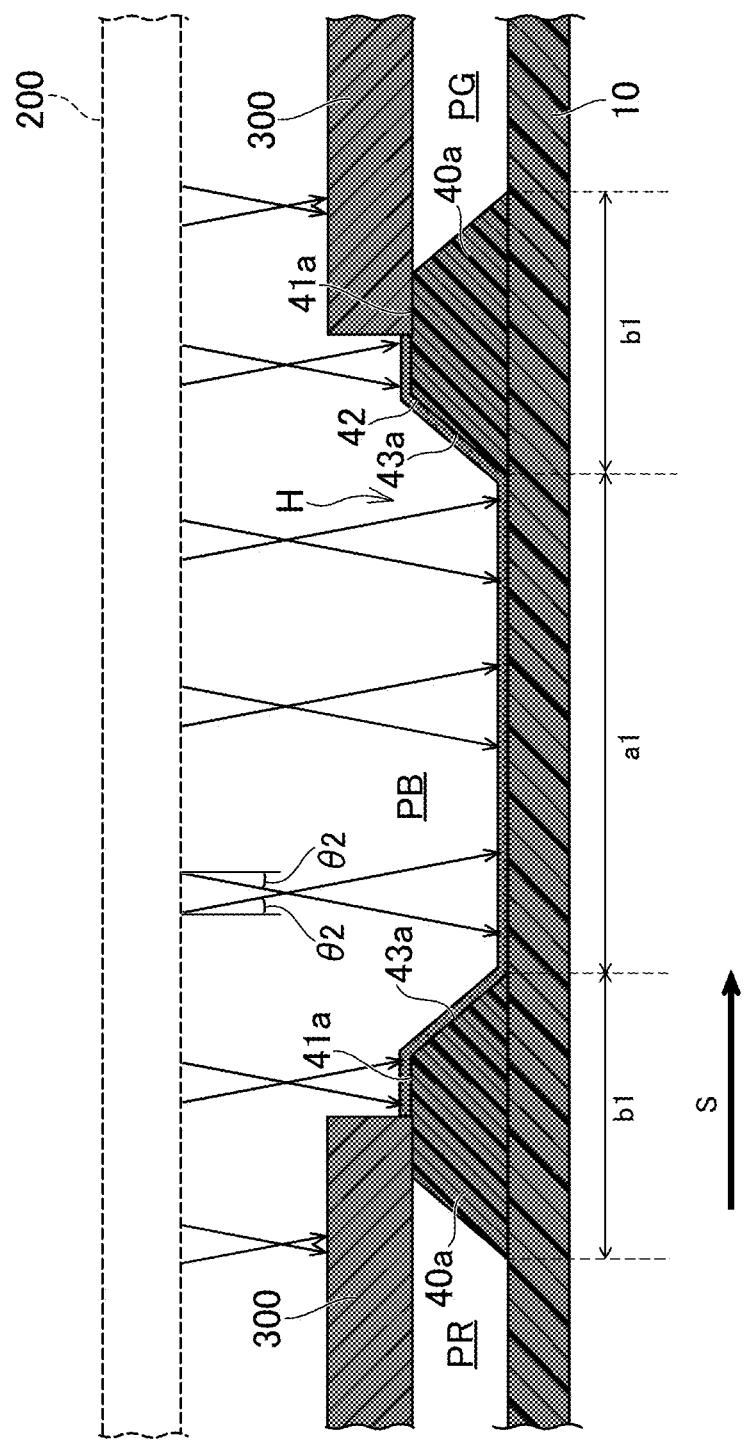
FIG. 5 is a cross-sectional view taken along line V-V in FIG. 4, illustrating the formation of an organic electroluminescent layer in the conventional example.
Figure 6:
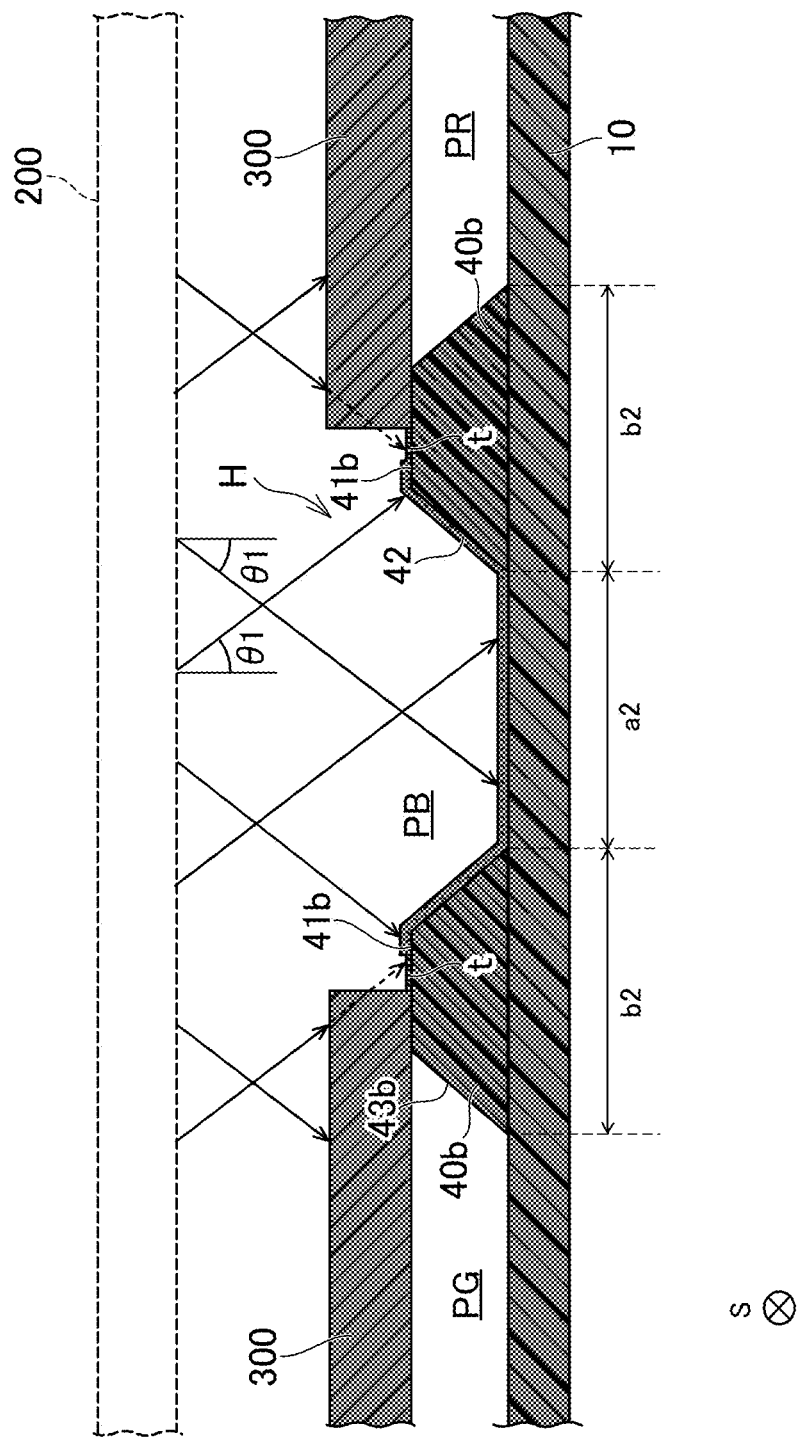
FIG. 6 is a cross-sectional view taken along line VI-VI in FIG. 4, illustrating the formation of the organic electroluminescent layer in the conventional example.
Figure 7:
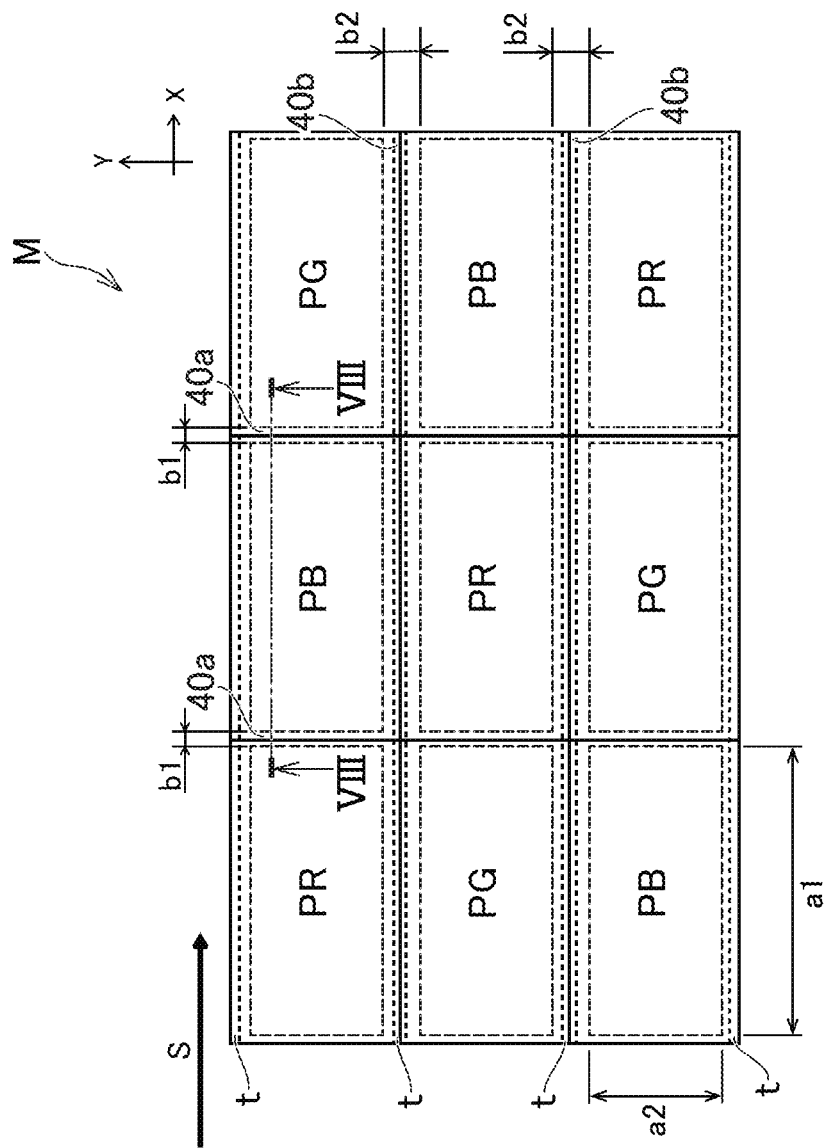
FIG. 7 is a plan view schematically showing a portion of a display region in the embodiment.
Figure 8:
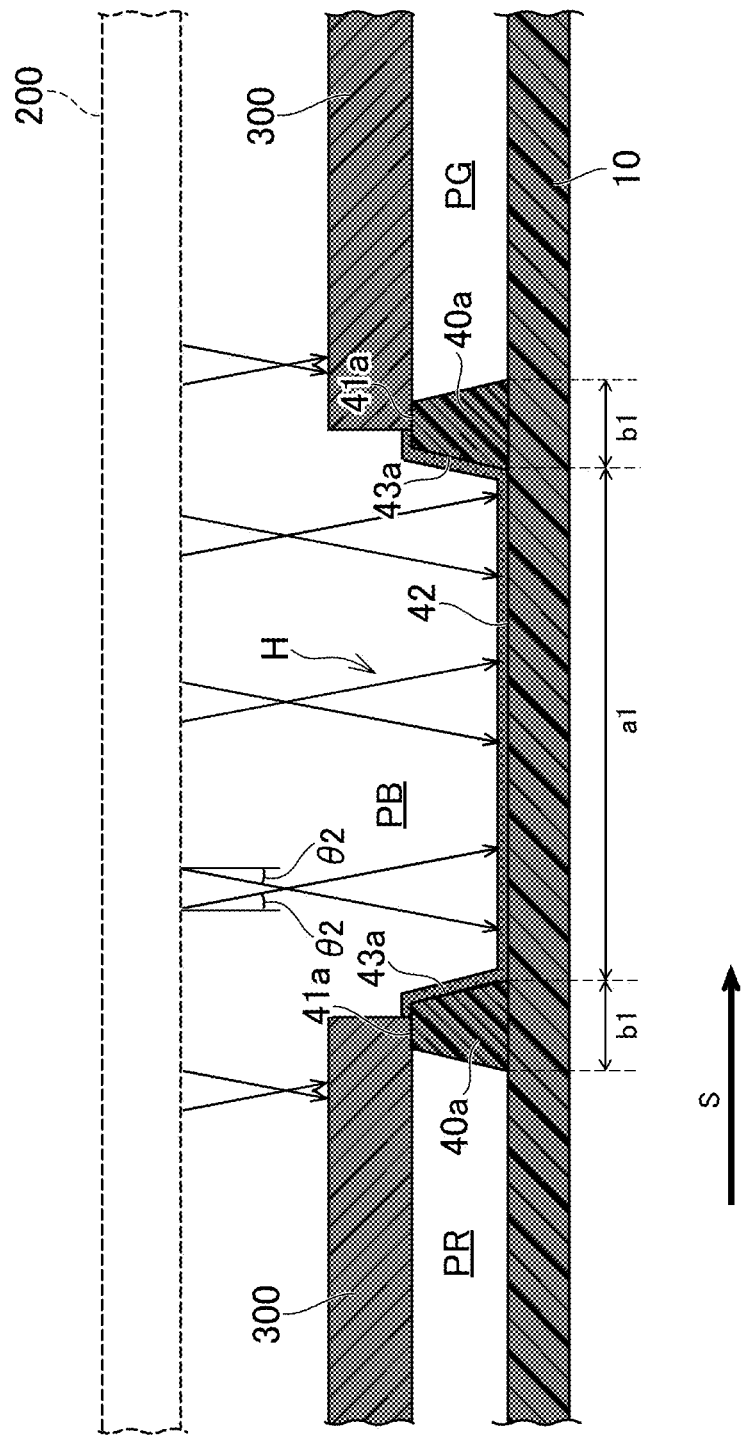
FIG. 8 is a cross-sectional view taken along line VIII-VIII in FIG. 7, illustrating the formation of an organic electroluminescent layer in the embodiment.

Here, with reference to FIGS. 3 to 8, the formation of the organic electroluminescent layer 42 will be described. FIG. 3 is a diagram illustrating a vapor deposition source. FIG. 4 is a plan view schematically showing a portion of a display region in a conventional example. FIG. 5 is a cross-sectional view taken along line V-V in FIG. 4, illustrating the formation of an organic electroluminescent layer in the conventional example. FIG. 6 is a cross-sectional view taken along line VI-VI in FIG. 4, illustrating the formation of the organic electroluminescent layer in the conventional example. FIG. 7 is a plan view schematically showing a portion of the display region in the embodiment. FIG. 8 is a cross-sectional view taken along line VIII-VIII in FIG. 7, illustrating the formation of the organic electroluminescent layer in the embodiment.

In FIGS. 5, 6, and 8, the layers other than the first substrate 10, the insulating layer 40, and the organic electroluminescent layer 42 are omitted for simplification of description. Moreover, in FIGS. 5, 6, and 8, for describing the details of the configuration of the insulating layer 40, the ratio of the width of the insulating layer 40 (the first extending portion 40a and the second extending portion 40b) to the width of the pixel region P is increased. The arrows in FIGS. 5, 6, and 8 represent the discharge of a material from a vapor deposition source 200.

The organic electroluminescent layer 42 is formed separately for each luminescent color by vapor deposition. Specifically, an organic material (hereinafter also referred to simply as "material") serving as the organic electroluminescent layer 42 is discharged from the vapor deposition source 200 shown in FIG. 3 through a vapor deposition mask 300 including an opening H, so that the organic electroluminescent layer 42 is pattern-formed so as to correspond to the shape of the opening H of the vapor deposition mask 300.

A so-called line source that is filled with the material and discharges the material from a plurality of discharge ports 200a is used as the vapor deposition source 200. A shield 200b for adjusting the discharge angle of the material is provided around the discharge ports 200a of the vapor deposition source 200 so as to overlap a portion of each of the discharge ports 200a along the Y-direction. For this reason, the discharge angle of the vapor deposition source 200 is different between the X-direction and the Y-direction in FIG. 3. Specifically, the vapor deposition source 200 is configured such that the shape thereof is long in the Y-direction in FIG. 3 and short in the X-direction, that the vapor deposition source 200 discharges the material at a maximum discharge angle $\theta 1$ in the X-direction and discharges the material at a maximum discharge angle $\theta 2$ in the Y-direction, and that the relation: $\theta 1 > \theta 2$ is satisfied. The maximum discharge angle $\theta 2$ can be adjusted by adjusting an area of the shield 200b that overlaps the discharge ports 200a. On the other hand, the maximum discharge angle $\theta 1$ can also be adjusted in the same manner, but the adjustment is difficult. This is because a plurality of shielding plates or slits provided in a shielding plate are required for the adjustment and it is necessary to perform the position adjustment for each of the plates or slits. Accordingly, manufacturing becomes easier when the discharge angle only in one direction is adjusted as in this example. As the angles $\theta 1$ and $\theta 2$ become closer to 0°, the material is discharged at an angle closer to perpendicular to the first substrate 10. Regions C1 and C2 in FIG. 3 schematically show regions where the material is discharged.

Here, with reference to FIGS. 4 to 6, the formation of an organic electroluminescent layer 42 in the conventional example and the problem thereof will be described. As shown in FIG. 4, the length of the long side of each of the pixel regions P is defined as a1, and the length of the short side of each of the pixel regions P is defined as a2. Moreover, the width of the first extending portion 40a of the insulating layer 40 is defined as b1, and the width of the second extending portion 40b of the insulating layer 40 is defined as b2. In the conventional example as shown in FIGS. 4 to 6, the width b1 of the first extending portion 40a and the width b2 of the second extending portion 40b are the same as each other.

First, the vapor deposition mask 300 including the opening H in a region corresponding to the blue pixel region PB is disposed on the first extending portion 40a and on the second extending portion 40b. The vapor deposition mask 300 is preferably disposed such that, in a plan view, one edge portion of the opening H overlaps the central portion of the first extending portion 40a in the width direction thereof and that another edge portion of the opening H overlaps the central portion of the second extending portion 40b in the width direction thereof.

Then, the first substrate 10 on which the insulating layer 40 is formed is relatively moved in a scan direction S with respect to the vapor deposition source 200 while the material is discharged from the vapor deposition source 200. Herein, the scan direction S is the X-direction.

As shown in FIG. 5, the material discharged at the maximum discharge angle $\theta 2$ from the vapor deposition source 200 is vapor-deposited on the blue pixel region PB and the first extending portion 40a, and thus the organic electroluminescent layer 42 that emits blue light is formed. Here, the maximum discharge angle $\theta 2$ is small, and the material is discharged onto the blue pixel region PB and the first extending portion 40a at an angle close to perpendicular to the first substrate 10; therefore, the organic electroluminescent layer 42 is vapor-deposited with a substantially uniform thickness.

On the other hand, as shown in FIG. 6, the material discharged at the maximum discharge angle $\theta 1$ from the vapor deposition source 200 is vapor-deposited on the blue pixel region PB and the second extending portion 40b, and thus the organic electroluminescent layer 42 that emits blue light is formed. Here, the maximum discharge angle $\theta 1$ is large compared to the maximum discharge angle $\theta 2$. Moreover, the vapor deposition mask 300 has a predetermined thickness, and therefore, a portion of the material obliquely discharged is obstructed at the edge portion of the opening H of the vapor deposition mask 300. Therefore, the material is not sufficiently vapor-deposited in the vicinity of the edge portion of the opening H of the vapor deposition mask 300, and thus a thin film region t (also referred to as "vapor deposition shadow" in some cases) where the film thickness of the organic electroluminescent layer 42 is thin is generated. As shown in FIG. 6, the thin film region t is generated at the edge portion of the organic electroluminescent layer 42 on the second extending portion 40b. The dotted arrows in FIG. 6 show the original traveling directions of the material that is obstructed at the edge portion of the opening H of the vapor deposition mask 300.

When the thin film region t of the organic electroluminescent layer 42 is generated in the light emitting region, an electric current is concentrated in the thin film region, which may cause the problem of a reduction in luminous efficiency. Therefore, the widths b1 and b2 of the insulating layer 40 are set such that the thin film region t is formed on the insulating layer 40 as a non-light emitting region. Here, the light emitting region is a region where the organic electroluminescent layer 42 is interposed between the common electrode 44 and the pixel electrode 36 in the pixel region P, and the non-light emitting region is a region where the organic electroluminescent layer 42 and the pixel electrode 36 are separated from each other due to the presence of the insulating layer 40 in the pixel region P.

In the conventional example, the width b1 of the first extending portion 40a is set to be the same as the width b2 of the second extending portion 40b. When the width of the insulating layer 40 is set wide, the space between the pixel regions P is increased, which is an obstacle to realizing a higher luminance and higher definition of pixels. Moreover, when the width of the insulating layer 40 is set narrow, the width b2 is narrowed, which causes the thin film region t to overlap the pixel region P. This allows an electric current to concentrate in the region, which becomes the cause of a reduction in luminous efficiency, a shorter life span, a color shift, or the like.

Therefore, in the embodiment as shown in FIGS. 7 and 8, the width b1 of the first extending portion 40a is made narrower than the width b2 of the second extending portion 40b. As shown in FIG. 8, the material discharged at the maximum discharge angle θ2 is vapor-deposited on the blue pixel region PB and the first extending portion 40a, and thus the organic electroluminescent layer 42 is formed. The maximum discharge angle θ2 is small, and the material discharged obliquely to the first substrate 10 is less likely to be obstructed by the edge portion of the opening H of the vapor deposition mask 300. Therefore, the thin film region t of the organic electroluminescent layer 42 is less likely to be generated also at the edge portion of the opening H of the vapor deposition mask 300, and the organic electroluminescent layer 42 is formed with a substantially uniform thickness. That is, even when the width b1 of the first extending portion 40a is narrowed, the problem such as a reduction in luminous efficiency due to the concentration of an electric current in the thin film region t is not caused.

In the embodiment, the space between the pixel regions P in the X-direction shown in FIG. 7 can be narrowed by an amount corresponding to the narrowing of the width b1 of the first extending portion 40a, which makes it possible to realize a higher definition and the like of pixels.

In the embodiment, the formation of the organic electroluminescent layer 42 on the blue pixel region PB and the second extending portion 40b is similar to that in FIG. 6 described in the conventional example, and therefore, a detailed description of the formation is omitted.

In the embodiment, an example has been shown in which the thin film region t of the organic electroluminescent layer 42 is formed on the second extending portion 40b but the thin film region t of the organic electroluminescent layer 42 is not formed on the first extending portion 40a. However, the invention is not limited to this example. For example, the thin film region t having a width narrower than that of the thin film region t formed on the second extending portion 40b may be formed on the first extending portion 40a.

In the embodiment, a configuration has been described in which the width b1 of the first extending portion 40a extending in the Y-direction is made narrower than the width b2 of the second extending portion 40b extending in the X-direction as shown in FIG. 7. However, the invention is not limited to this configuration. It is sufficient to narrow the width of either the first extending portion 40a or the second extending portion 40b, whichever the thin film region t is still less likely to be generated on, depending on the discharge direction and discharge angle of the material discharged from the vapor deposition source 200.

In the above, only the organic electroluminescent layer 42 that is formed in the blue pixel region PB has been described. However, also in the red pixel region PR and the green pixel region PG, the organic electroluminescent layers 42 corresponding to the respective colors are vapor-deposited in the same manner.

Figure 9:
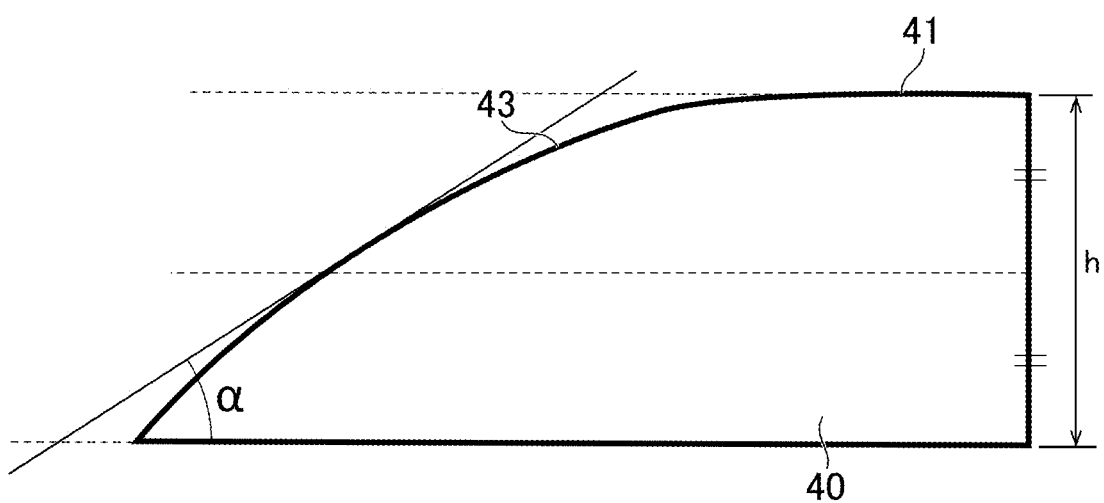
FIG. 9 is a diagram illustrating an inclination angle of an inclined surface of an insulating layer in the embodiment.

Further, with reference to FIGS. 6, 8, 9, and 10, the details of the insulating layer 40 in the embodiment will be described. FIG. 9 is a diagram illustrating an inclination angle of an inclined surface of the insulating layer in the embodiment. FIG. 10 is a diagram illustrating the formation of the insulating layer using a halftone mask in the embodiment.

In FIG. 8 and the like, the first extending portion 40a of the insulating layer 40 includes a top portion 41a and inclined surfaces 43a provided at both edges of the top portion 41a. The second extending portion 40b of the insulating layer 40 includes a top portion 41b and inclined surfaces 43b provided at both edges of the top portion 41b. In FIG. 8 and the like, an example is shown in which the inclined surface of the insulating layer 40 is a plane. However, the inclined surface may be a gently curved surface as in FIG. 9.

Hereinafter, as shown in FIG. 9, the angle formed by the tangent to an inclined surface 43 at a height h/2, where h is the height of a top portion 41 of the insulating layer 40, and the bottom surface of the insulating layer 40 is defined as the inclination angle (α in FIG. 9) of the inclined surface 43.

In the embodiment, the width b1 of the first extending portion 40a in a plan view is made smaller than the width b2 of the second extending portion 40b by making the width of the top portion 41a of the first extending portion 40a smaller than the width of the top portion 41b of the second extending portion 40b in the plan view. Moreover, as shown in FIGS. 6 and 8, the inclination angle of the inclined surface 43a of the first extending portion 40a is made larger than the inclination angle of the inclined surface 43b of the second extending portion 40b.

Moreover, it is preferable that the height of the top portion 41a of the first extending portion 40a is made the same as the height of the top portion 41b of the second extending portion 40b. This is because when the vapor deposition mask 300 is disposed so as to lie on the top portion 41a and on the top portion 41b, a gap is generated between the vapor deposition mask 300 and the insulating layer 40 if the heights of the top portions are different, which may cause the material discharged from the vapor deposition source 200 to be vapor-deposited on the next pixel region P through the gap. For example, when the organic electroluminescent layer 42 to be formed in the blue pixel region PB is formed in the red pixel region PR next thereto, a color mixture occurs.

The inclined surface 43 of the insulating layer 40 is formed preferably using a halftone mask 400. As shown in FIG. 10, the halftone mask 400 preferably includes openings, light shielding portions 410, and semi-transmission portions 420. The light shielding portion 410 blocks light, and the semi-transmission portion 420 partially transmits light.

First, a photosensitive resin film constituting the insulating layer 40 is formed on the first substrate 10. Then, the halftone mask 400 is disposed on the photosensitive resin film, and the opening and the inclined surface 43 of the insulating layer 40 are formed by performing exposure and patterning. In this case, the light shielding portion 410 corresponds to a position corresponding to the top portion 41 of the insulating layer 40, and the semi-transmission portion 420 corresponds to the inclined surface 43.

In the embodiment, the inclination angle of the inclined surface 43a of the first extending portion 40a is made larger than the inclination angle of the inclined surface 43b of the second extending portion 40b. For example, the semi-transmission portion 420 is provided at a position corresponding to the inclined surface 43a, and the semi-transmission portion 420 is not provided at a position corresponding to the inclined surface 43b. Moreover, when the inclined surface 43b is also to be inclined to some extent, the semi-transmission portion 420 may be provided at positions corresponding to both the inclined surfaces. For example, the inclination angle of the inclined surface 43a is preferably set to approximately 70°, and the inclination angle of the inclined surface 43b is preferably set to approximately 30°. For achieving such a configuration, it is preferable to use the halftone mask 400 in which the width of the semi-transmission portion 420 disposed at the position corresponding to the inclined surface 43a is narrower than the width of the semi-transmission portion 420 disposed at the position corresponding to the inclined surface 43b. In addition, an exposure amount, an exposure time, and the like are preferably made different between the inclined surface 43a and the inclined surface 43b such that the inclination angle of the inclined surface 43a becomes larger than the inclination angle of the inclined surface 43b.

By forming the insulating layer 40 as described above, the heights of the top portion 41a and the top portion 41b are same, the width of the first extending portion 40a is narrower than the width of the second extending portion 40b, and the inclination angle of the inclined surface 43a is larger than the inclination angle of the inclined surface 43b.

The invention is not limited to the embodiment described above but can be variously modified. For example, the configuration described in the embodiment may be replaced with substantially the same configuration, a configuration providing the same operational effect, or a configuration capable of achieving the same object.

What is claimed is:

1. A display device comprising:
   an insulating layer including first extending portions and second extending portions, and respective of the first extending portions and respective of the second extending portions defining a pixel which is surrounded by the respective first extending portions and the respective second extending portions, the first extending portions extending in a first direction along a first side of the pixel, the second extending portions extending in a second direction along a second side of the pixel, the second direction crossing the first direction; and
   an organic electroluminescent layer formed in the pixel, on the first extending portions, and on the second extending portions,
   a substrate including a display region where a plurality of the pixels are disposed in a matrix, wherein
   the pixel has a rectangular shape including a long side and a short side in the plan view,
   the first side is along the short side, and the second side is along the long side,
   the first extending portions are provided between the short sides of adjacent pixels,
   the second extending portions are provided between the long sides of adjacent pixels, and
   a first width of the first extending portions in the second direction in a plan view is smaller than a second width of the second extending portions in the first direction; wherein
   the substrate is under the insulating layer,
   the first extending portions include a first top portion and first inclined surfaces formed at both edges of the first top portion which are along the first side,
   the second extending portions include a second top portion and second inclined surfaces formed at both edges of the second top portion which are along the second side,
   a first angle between the first inclined surface and the substrate is larger than a second angle between the second inclined surface and the substrate,
   heights of the first top portion and the second top portion are same, and
   the organic electroluminescent layer is formed by vapor deposition.

2. The display device according to claim 1, wherein the organic electroluminescent layer has a first region, a second region, and a center region surrounded by the first region and the second region,
   the second region is formed along the second extending portions in the plan view, and
   the second region is thinner than the center region.

3. The display device according to claim 2, wherein the first region is formed along the first extending portions in the plan view, and
   the first region is thinner than the center region.

4. The display device according to claim 1, wherein a width of the first top portion in the plan view is smaller than a width of the second top portion.

5. The display device according to claim 1, wherein the organic electroluminescent layer is formed in each of the plurality of the pixels for each luminescent color.

* * * * *